United States Patent [19]

Imel

[11] Patent Number: 4,694,425
[45] Date of Patent: Sep. 15, 1987

[54] SEVEN TRANSISTOR CONTENT ADDRESSABLE MEMORY (CAM) CELL

[75] Inventor: Michael T. Imel, Beaverton, Oreg.

[73] Assignee: Intel Corporation, Santa Clara, Calif.

[21] Appl. No.: 884,025

[22] Filed: Jul. 10, 1986

[51] Int. Cl.⁴ ............................................. G11C 15/04
[52] U.S. Cl. ...................................... 365/49; 365/154
[58] Field of Search .................. 365/49, 154, 155, 156, 365/190

[56] References Cited

U.S. PATENT DOCUMENTS 4,532,606  7/1985  Phelps .................................... 365/49

FOREIGN PATENT DOCUMENTS 0441592  12/1974  U.S.S.R. ................................ 365/49

OTHER PUBLICATIONS

IBM Technical Disclosure Bulletin—vol. 17, No. 3, Aug. 1974, pp. 882–883.
IBM Technical Disclosure Bulletin—vol. 17, No. 4, Sep. 1974, pp. 1058–1059.

Primary Examiner—James W. Moffitt
Attorney, Agent, or Firm—Owen L. Lamb

[57] ABSTRACT

A content addressable memory including a pair of column lines (54, 56) upon which information to be matched with the contents of said memory is placed. The memory is driven by a clock such that during particular clock phase a ROW line (50) and a MATCH line (52) are precharged and both column lines are discharged. The memory cell is comprised of transistors (M1, M2, M3, M4) connected to each other and to a supply voltage (Vcc) to thereby form a cross-coupled inverter storage device. Transistors (M5, M6) are connected to diode transistor (M7) and between the cross-coupled inverter (M1, M2, M3, M4) and column lines (54, 56) to thereby form and XOR gate on said column lines (54, 56) and diode transistor (M7). The diode transistor is connected between transistors (M5, M6), ROW line (50) and MATCH line (52), such that during CAM matches the diode transistor allows charge to be siphoned from MATCH line (52) and during a write to said CAM cell allows charge to build up.

8 Claims, 7 Drawing Figures

SEVEN TRANSISTOR CONTENT ADDRESSABLE MEMORY (CAM) CELL

TECHNICAL FIELD

This invention relates to integrated logic circuits, and more particularly, to a content addressable memory (CAM) cell.

BACKGROUND ART

A content addressable memory (CAM) is a storage device in which storage locations are identified by their contents, not by names or positions. A search argument is presented to the CAM and the location that matches the argument asserts a corresponding match line. One use for such a memory is in dynamically translating logical addresses to physical addresses in a virtual memory system. In this case the logical address is the search argument and the physical address is produced as a result of the dynamic match line selecting the physical address from a storage location in a random access memory (RAM).

The major technical challenge in the design of an integrated circuit CAM cell is to achieve the desired function, performance and cost objectives by optimizing the speed, density, power consumption, risk, and design time of the implementation's circuitry.

Three prior art content addressable memory (CAM) cells that are compatible with a dynamic match line design are shown in FIGS. 1A, 1B, and 1C. The first (FIG. 1A) and smallest CAM cell, a 4-transistor design, requires a circuit design that necessitates multiplexing the power, row selection and CAM functions all onto a single row signal (10). This design is considered to be too difficult to meet speed goals as well as being risky.

The second prior art CAM cell (FIG. 1B) has a separate match line (12) and row select (14). It uses a more traditional and conservative design that can be easily sized to meet the speed goals presented above; however, it consumes about three times the chip area of a standard six transistor RAM cell.

The third prior art CAM cell (FIG. 1C) is slower due to the two series P-devices (14, 16) required to charge the match line (18). Although this cell can be very chip-area efficient, the row pitch of the most area efficient version of the cell mismatches the row pitch of a six transistor RAM by more than 50%. The cell also makes the column line drivers pitch extremely narrow. The amount of chip area lost matching the pitch of this cell consumes any chip area savings gained by the cell itself.

The design of a satisfactory CAM cell has to satisfy the following constraints:

1. It needs to be fast: all 48 by 27-bit entries must be searched for a match in about one half of a clock phase (15 ns).
2. It needs to be small and meet the pitch of corresponding RAM cells.
3. It must consume less than 200 mW of power at a 16 Mhz microcycle frequency.

The need for low power and tight layout pitch immediately disallows all static design approaches. A static design requires forty-eight 27-input AND gates to implement the CAM match function. It is of course possible to construct a low-power 27-input AND gate that operates within the 15 ns design goal; however, it requires building three levels of three input NAND and NOR gates and is not amenable to the pitch or area constraints mentioned above. A simple static load approach that does meet pitch and area constraints fails to meet low-power requirements. A static load approach consumes more than five times as much power as a dynamic match-line approach.

It is therefore an object of the present invention to provide a dynamic match line content addressable memory cell that consumes low power and conforms to a tight layout pitch to meet the needs of a corresponding random access memory.

DISCLOSURE OF THE INVENTION

The above object is accomplished in accordance with the invention by providing a content addressable memory including a pair of column lines (54, 56) upon which information to be matched with the contents of said memory is placed The memory is driven by a clock such that during particular clock phase a ROW line (50) and a MATCH line (52) are precharged and both column lines are discharged The memory cell is comprised of first, second, third and fourth transistors connected to each other and to said a supply voltage to thereby form a cross-coupled inverter storage device. Fifth and sixth transistors are connected to a seventh transistor, that is programmed to perform like a reversible diode, and between the cross-coupled inverter and the column lines to thereby form an XOR gate on said column lines and diode transistor. The "diode" transistor is connected between the fifth and sixth transistors, the ROW line and the MATCH line, such that during CAM matches the diode transistor allows charge to be siphoned from MATCH line and during a write to said CAM cell allows charge to build up.

This CAM cell has the advantages of low power, an area-efficient layout that matches the row pitch of the RAM array, and it easily meets the speed objectives.

The CAM cell design enables the content addressable memory to do an address translation in one microcycle; yet, the cell consumes less area than the prior art CAM cells.

BRIEF DESCRIPTION OF DRAWINGS

The foregoing and other objects, features, and advantages of the invention will be apparent from the following detailed description of a preferred embodiment of the invention as illustrated in the accompanying drawings wherein.

BEST MODE FOR CARRYING OUT THE INVENTION

Figure 2:
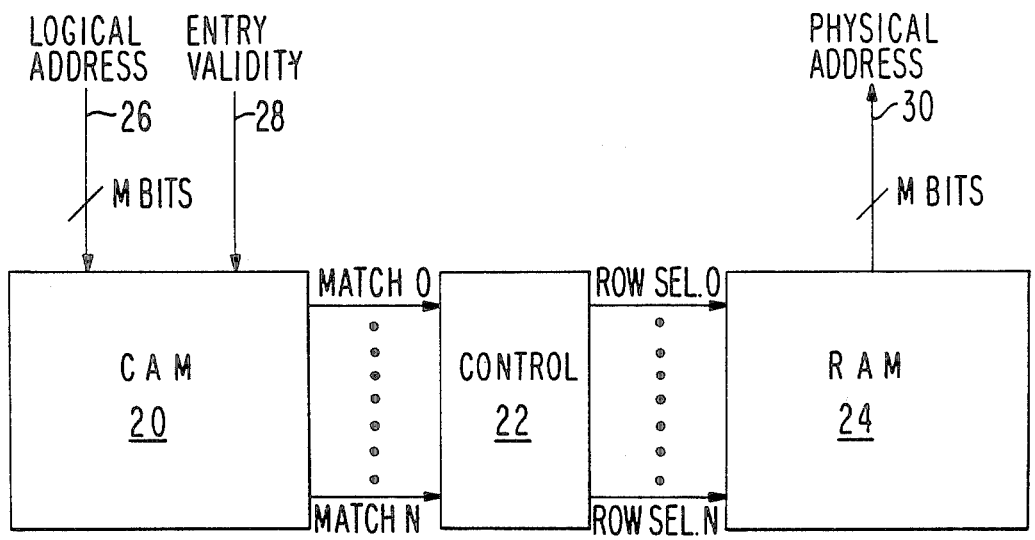
FIG. 2 is a diagram of a content addressable memory address translation system in which the present invention is embodied.

A simplified block diagram of a content addressable memory address translation system in which the present invention is embodied is shown in FIG. 2. This circuit performs address translations using a content addressable memory (CAM). The main components are a content addressable memory (20), control (22) and a random access memory (24). An M-bit logical address (26)

is input to the CAM (20) along with an entry valid bit (28). The entry valid bit ensures that the entry has been initialized and that the contents of the entry are still valid. If the address input to the CAM matches an address entry in the CAM, one of the match lines (O-N) corresponding to that entry is asserted. The control logic (22) asserts the corresponding row select line (O-N) to the RAM (24). The corresponding RAM entry is placed on the physical address lines (30).

Figure 3:
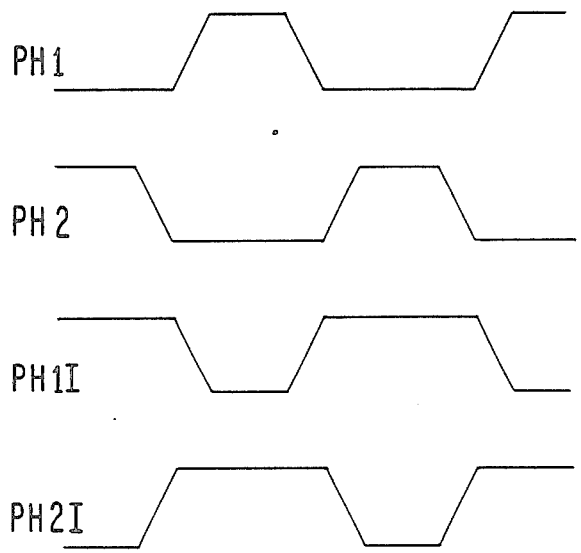
FIG. 3 is a timing diagram of a two-phase non-overlapping clock for driving the system shown in FIG. 2.

The circuit of FIG. 2 is driven by a two non-overlapping clock phase design such as is found in the Intel 80286 and 80386. Four clocks, PH1, PH1I, PH2, PH2I, are distributed in the chip (FIG. 3). PH1 and PH2 are traditional NMOS non-overlapping clocks with equal duty cycles. PH1I and PH2I are the PMOS analogs to PH1 and PH2 and are exactly inversions of PH1 and PH2 respectively. Successive PH1 and PH2 assertions form a microcycle that is 62.5 ns when the chip is operated at 16 Mhz frequency.

Figure 1A:
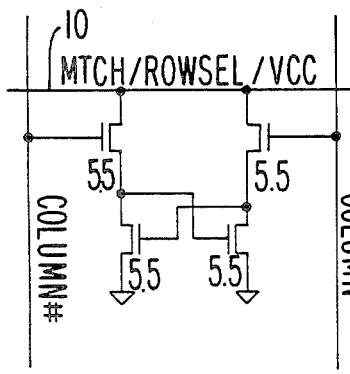
FIGS. 1A, 1B, and 1C are schematic diagrams of prior art CAM cells.
Figure 1B:
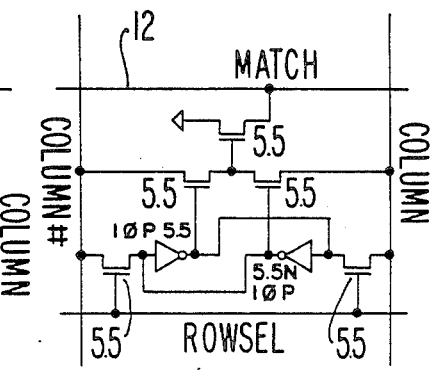
Figure 1C:
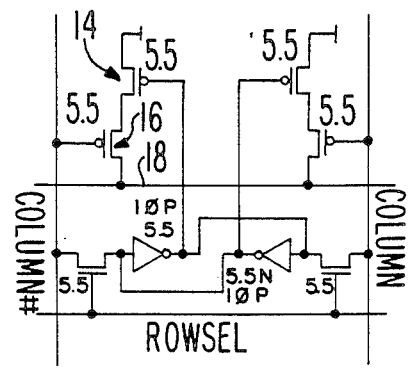
Figure 4:
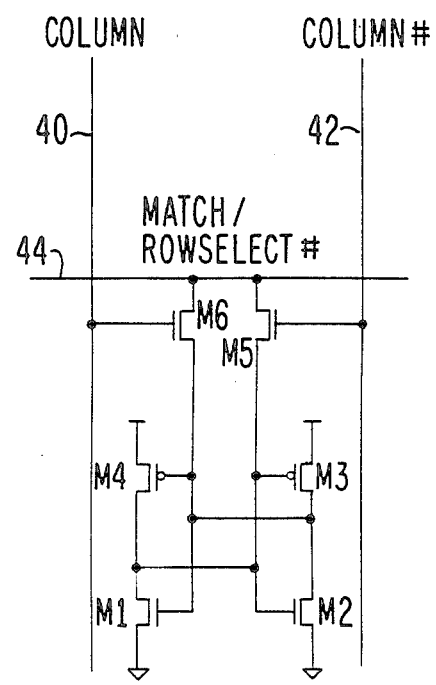
FIG. 4 is a diagram of a six transistor CAM cell.

FIG. 4 is a diagram of a six transistor CAM cell which is an improvement over the the small four transistor CAM cell shown in FIG. 1A. The cross-coupled inverters (M3, M4) in this six transistor cell are much more noise resistant and dissipate much less power in a steady state than the N-device loads (M1, M2). Transistors M5 and M6 form an XOR gate on the column (40, 42) and MATCH/ROWSELECT line (44). The MATCH/ROWSELECT line is considered at high voltages (V>VCC/2) to be a NOR-tied output.

The cell design of FIG. 4 presents a difficult design problem to solve: when 26 out of 27 CAM cells mismatch, each of the mismatching cells pulls down on the MATCH line (44) discharging it to near zero volts. Only the matching cell will fight this action momentarily. The matching cell will be flipped or else the cell cannot be written when a cell write function is attempted. CAM matching achieved in this manner produces the undesirable side effect of writing into adjacent matching cells.

One method to combat this adjacent-cell-write mechanism is to design a negative feedback system into the MATCH line that is disabled during writes. This feedback circuit should not let the MATCH line voltage fall much below VCC/2 in order to inhibit overwriting matching cells. This type of feedback circuit, however, will consume a lot of power because, in the worst case, it has to fight 27 parallel stacked N-device pulldown structures in all 48 rows.

A lower power solution is to integrate a reversible diode between the transistors M5, M6 and the MATCH line (44). During CAM matches this diode should only allow charge to be siphoned from the match line, but with the reverse action during writes.

Figure 5:
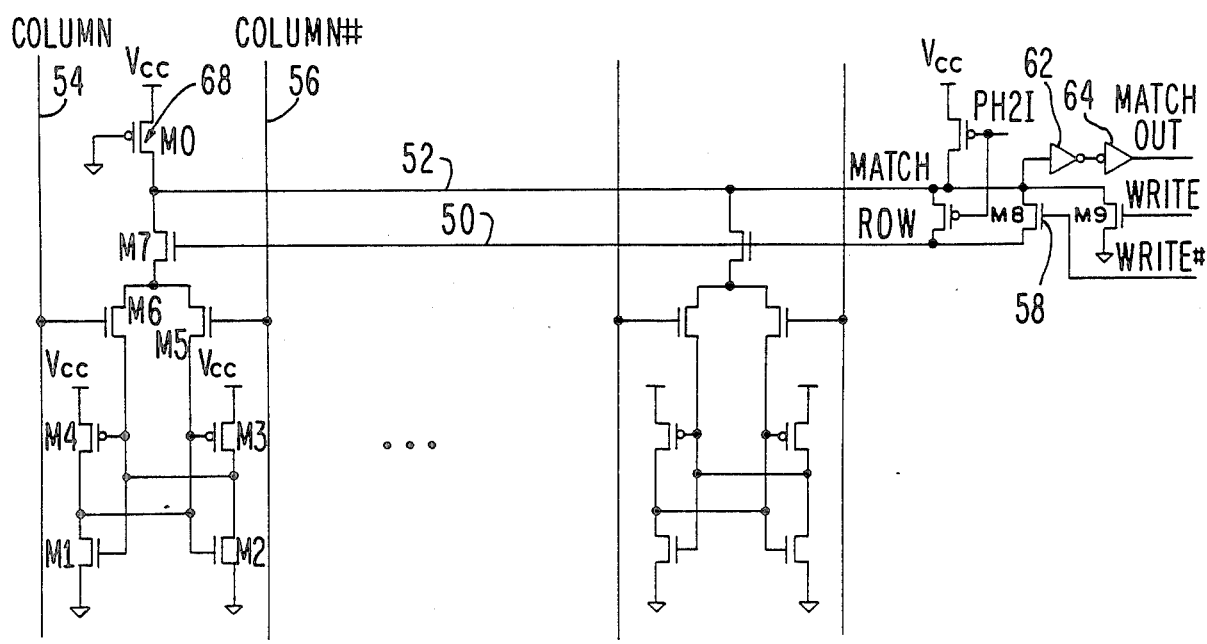
FIG. 5 is a diagram of the seven transistor CAM cell and write circuitry logic utilized in the CAM component shown in FIG. 2.

The seven transistor CAM cell of FIG. 5 provides such a programmable diode, transistor M7, in each cell. One transistor, MB, is allocated to each row to program the diode.

During clock PH2 (FIG. 3) the ROW line (50) and MATCH line (52) are precharged and both column lines (54, 56) are discharged. The data to be matched is placed onto the column lines, COLUMN and COLUMN # during PH1. The gate (58) of transistor M8, connected to WRITE#, is always at VCC during matching cycles. If a mismatch occurs, the MATCH line (52) is pulled low through M1, M5, M7 or through M2, M6, and M7. If all cells in a row match, then the MATCH line (52) stays high and a match is obtained. Cells that match will try to hold the MATCH line high. This action cannot start until the source (52) of M7 drops a threshold voltage below VCC. If this has happened then M8 also starts to turn on forcing the ROW and MATCH lines voltages to equalize. This effectively disconnects all cells trying to pull-up on the MATCH line and thus stops mis-matching cells from flipping matching cells.

Due to the back-body effect, the threshold voltage of an N-device is quite high when its drain and source are at 5 volts. This turns out to be a big advantage to the seven transistor cell's operation. The voltage that is sensed to determine whether a match has occurred is actually less than the N-device threshold voltage. This means that when only a single cell mismatches on a row (worst case speed-path), it only needs to discharge the capacitance on the MATCH line by itself. The ROW line stays isolated from the MATCH line due to M8's high threshold until after the sensing voltage (about 1 Volt) has been developed. A ratioed inverter pair (62, 64) is used to sense the voltage swing on the MATCH line (52).

To write into the cell during clock PH1, the ROW signal (50) is isolated from the MATCH line (52) by turning off transistor M8 (WRITE #) for the selected row only. This insures that the ROW line (50) stays at its precharged high voltage to enable writing (WRITE). Then only the selected row's MATCH line is pulled low by M9.

Finally, the column lines (54, 56) source the negative-true form of the data to be stored into each cell. This effects writing into the cells of the selected rows. All unselected rows essentially perform a match cycle during this time.

To guard against noise and leaky transistors a very weak P-device (68) with its gate grounded has its source connected to the MATCH line (52). This P-device also extends the operation of the CAM into the low frequency region (theoretically it should be capable of DC operation) with very little increase in power dissipation (less than 5 mw for the whole CAM).

There are at least two aspects of this design that must be carefully tuned. Transistor M9 needs to be large enough to flip all 27 cells in the process of a row write. When 26 cells mismatch and one cell matches, the 26 mismatching cells act as a very large pull-down on the match line and could possibly flip the one matching cell if transistor M8 is not large enough or there is excessive resistance on the ROW or MATCH lines.

The seven transistor CAM cell shown in FIG. 5 and its associated circuitry has the advantages of low power, an area-efficient layout that matches the row pitch of the RAM array, and it easily meets the speed objectives.

The seven-transistor CAM cell design shown in FIG. 5 enables the content addressable memory shown in FIG. 2 to do an address translation in one microcycle; yet, the seven-transistor cell consumes less area than the prior art CAM cells.

While the invention has been particularly shown and described with reference to preferred embodiments thereof, it will be understood by those skilled in the art that the foregoing and other changes in form and detail may be made therein without departing from the scope of the invention.

What is claimed is:

1. A content addressable memory including a pair of column lines (54, 56) upon which information to be matched with the contents of said memory is placed, said memory being driven by a clock such that during particular clock phase a ROW line (50) and a MATCH line (52) are precharged and both column lines are discharged, a memory cell characterized by:
- a supply voltage (Vcc):
- a first transistor (M1);
- a second transistor (M2);
- a third transistor (M3);
- a fourth transistor (M4);
- said first, second, third and fourth transistors being connected to each other and to said supply voltage (Vcc) to thereby form a cross-coupled inverter storage device;
- a fifth transistor (M5);
- a sixth transistor (M6); and,
- a seventh transistor (M7) that acts as a "reversible diode";
- said fifth and a sixth transistors being connected to said "diode" transistor (M7) and between said cross-coupled inverter (M1, M2, M3, M4) and said column lines (54, 56) to thereby form an XOR gate on said column lines (54, 56) and said "diode" transistor (M7);
- said diode transistor being connected between said fifth and sixth transistors, said ROW line (50) and said MATCH line (52), such that during CAM matches said diode transistor allows charge to be siphoned from said MATCH line (62) and during a write to said CAM cell allows charge to build up.

2. The combination in accordance with claim 1 further comprising:
- an eighth transistor (M8) connected between said MATCH line and said ROW line for programming said diode (M7); and,
- means for maintaining the gate (58) of said transistor (M8) at said supply voltage (Vcc) during matching cycles.

3. The combination in accordance with claim 1 further comprising a ratioed inverter pair (62, 64) connected to said ROW line and to said MATCH line for sensing voltage swings on said MATCH line.

4. The combination in accordance with claim 1 further comprising:
- a very weak P-device transistor (M10);
- the gate of said P-device being connected to ground;
- the source of said P-device being connected to said MATCH line to thereby guard against noise and leaky transistors and to extend the operation of said CAM cell into the low frequency region.

5. The combination in accordance with claim 1 further comprising a "writing" N-device transistor (M9) is of sufficient power so as to flip all cells in a selected row during a row write.

6. The combination in accordance with claim 2 further comprising a ratioed inverter pair of transistors (62, 64) connected to said ROW line and to said MATCH line for sensing voltage swings on said MATCH line.

7. The combination in accordance with claim 2 further comprising:
- a very weak P-device transistor (M10);
- the gate of said P-device being connected to ground;
- the source of said P-device being connected to said MATCH line to thereby guard against noise and leaky transistors and to extend the operation of said CAM cell into the low frequency region.

8. The combination in accordance with claim 2 wherein said N-device transistor (M9) is of sufficient power so as to flip all cells in a selected row during a row write.

* * * * *